(12) United States Patent
Kageyama

(10) Patent No.: US 9,185,193 B2
(45) Date of Patent: Nov. 10, 2015

(54) GASKET STRUCTURE FOR A TERMINAL APPARATUS

(71) Applicant: SONY MOBILE COMMUNICATIONS INC., Tokyo (JP)

(72) Inventor: Yasuhiro Kageyama, Tokyo (JP)

(73) Assignees: SONY CORPORATION, Tokyo (JP); SONY MOBILE COMMUNICATIONS INC., Tokyo (JP)

( * ) Notice: Subject to any disclaimer, the term of this patent is extended or adjusted under 35 U.S.C. 154(b) by 111 days.

(21) Appl. No.: 13/859,535

(22) Filed: Apr. 9, 2013

(65) Prior Publication Data

US 2013/0273985 A1    Oct. 17, 2013

Related U.S. Application Data

(60) Provisional application No. 61/624,672, filed on Apr. 16, 2012.

(51) Int. Cl.
| | |
|---|---|
| H04M 1/00 | (2006.01) |
| H04M 1/02 | (2006.01) |
| H05K 5/06 | (2006.01) |
| H04M 1/18 | (2006.01) |

(52) U.S. Cl.
CPC .............. *H04M 1/0202* (2013.01); *H04M 1/18* (2013.01); *H05K 5/061* (2013.01)

(58) Field of Classification Search
CPC ............ H04M 1/0206; H04M 1/0249; H04M 1/0208; H04M 1/0235; H04M 1/0254; H04M 1/026; H04M 1/0279
USPC ................... 455/575.1, 575.8, 90.3
See application file for complete search history.

(56) References Cited

U.S. PATENT DOCUMENTS

| | | | |
|---|---|---|---|
| 2002/0193136 A1* | 12/2002 | Halkosaari et al. | 455/550 |
| 2006/0140439 A1 | 6/2006 | Nakagawa | |
| 2009/0312058 A9* | 12/2009 | Wood et al. | 455/566 |
| 2011/0077063 A1* | 3/2011 | Yabe et al. | 455/575.4 |
| 2012/0127043 A1* | 5/2012 | Imano et al. | 343/702 |
| 2012/0238326 A1* | 9/2012 | Mori et al. | 455/566 |

FOREIGN PATENT DOCUMENTS

| | | |
|---|---|---|
| EP | 1 633 015 A1 | 3/2006 |
| JP | 2011-35089 | 2/2011 |
| WO | WO 2006/080748 A1 | 8/2006 |

OTHER PUBLICATIONS

Extended European Search Report issued Jul. 2, 2013 in Patent Application No. 13162925.5.

* cited by examiner

*Primary Examiner* — Temica M Beamer
(74) *Attorney, Agent, or Firm* — Oblon, McClelland, Maier & Neustadt, L.L.P.

(57) ABSTRACT

A gasket structure including a gasket that is disposed at a connecting portion between a first case and a second case, has a large-width portion at a certain portion of the first case where a key or a terminal is disposed, and is made of a flexible material; and a core member that is attached to at least the large-width portion of the gasket.

5 Claims, 13 Drawing Sheets

GASKET STRUCTURE FOR A TERMINAL APPARATUS

CROSS REFERENCE TO RELATED APPLICATIONS

This application is related to and claims priority under 35 U.S.C. §119(e) to Provisional Application Ser. No. 61/624,672, filed Apr. 16, 2012, the contents of which are hereby incorporated herein by reference.

BACKGROUND

1. Field

This disclosure relates to a gasket structure used in a case having a waterproof structure and to a terminal device including a case having such a gasket structure.

2. Description of the Related Art

Waterproof terminal devices serving as compact terminal devices, such as mobile phone terminal devices, are being developed. The waterproof terminal devices use a gasket to maintain the airtightness inside a case. The gasket is formed of a flexible resin and is disposed at a connecting portion when the case is assembled. Because the gasket is disposed at the connecting portion of the case, the gasket fills a gap at the connecting portion, preventing water from entering the case.

PTL 1 discloses a waterproof structure achieved by filling a gap in a case with a gasket when the case of a mobile phone terminal device is assembled.

CITATION LIST

[Patent Literature]

[PTL 1] Japanese Unexamined Patent Application Publication No. 2011-35089

Electronic devices, such as mobile phone terminal devices, have a key operated by a user and terminals into which various types of plugs are inserted. If the terminal devices are intended to have a waterproof structure, the portions where the key and the terminals are disposed also need to have a waterproof structure, which requires a complex mechanism. For example, when a gasket is used to achieve a waterproof structure, a gasket for sealing a portion where the key is disposed and a gasket for sealing a portion where the terminals are disposed are required, in addition to a gasket for sealing a connecting portion of a case body. Because the structures of the portions where the key and the terminals are disposed are complex, specific gaskets having complex shapes are required.

As described above, waterproof terminal devices having a key and terminals have complex structures because they require a gasket for filling a gap in the case body and gaskets for filling the portions where the key and the terminals are disposed.

The present inventor recognizes the need to simplify the configuration when achieving a waterproof structure for a terminal device with a key or a terminal.

BRIEF SUMMARY

A gasket structure of this disclosure includes a gasket that is made of a flexible material and is disposed at a connecting portion between a first case and a second case. The gasket has a large-width portion at a certain portion of the first case where a key or a terminal is disposed. The gasket also has a core member that is attached to at least the large-width portion of the gasket.

Furthermore, the terminal device of this disclosure includes a first case in which the key or the terminal is disposed at a certain portion and a second case joined to the first case. The terminal device further includes a gasket that is disposed at a connecting portion between the first case and the second case, has a large-width portion at the certain portion, and is made of a flexible material. A core member is attached to at least the large-width portion of the gasket.

According to this disclosure, because the portion where the key or the terminal is disposed is covered by the large-width portion of the gasket for sealing the connecting portion of the cases, both the connecting portion of the cases and the portion where the key or the terminal is disposed can be sealed with a single gasket for waterproofing. Accordingly, the number of gaskets used in a waterproof terminal device can be reduced, thereby simplifying the structure of the terminal device.

DETAILED DESCRIPTION

Figure 1:
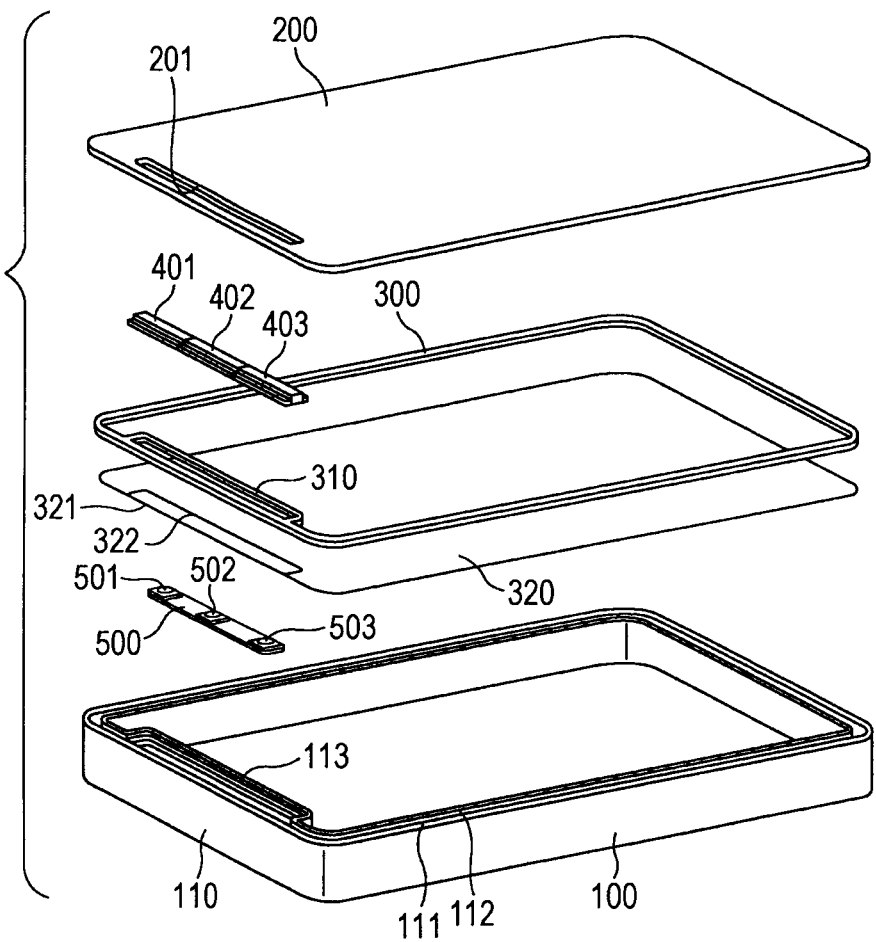
FIG. 1 is an exploded perspective view of cases according to a first embodiment of this disclosure.

Referring to the drawings, examples of gasket structures and terminal devices according to embodiments of this disclosure will be described in the following order.
1. First Embodiment
1-1. Configuration of Case (FIGS. 1 and 2)
1-2. Configuration of Gasket (FIG. 3)
1-3. Configuration of Key-Disposing Portion (FIGS. 4 to 6)
1-4. Modification 1 (FIG. 7)
1-5. Modification 2 (FIGS. 8 to 9)
1-6. Modification 3 (FIG. 10)
2. Second Embodiment
2-1. Configuration of Case (FIG. 11)
2-2. Configuration of Gasket (FIGS. 12 and 13)
2-3. Configuration of Key-Disposing Portion (FIGS. 14 and 15)
3. Third Embodiment
3-1. Configuration of Case (FIGS. 16 to 18)
3-2. Configuration of Terminal Portion (FIG. 19)
4. Other Modifications (FIG. 20)

1. First Embodiment

A terminal device of an example of a first embodiment of this disclosure will be described below with reference to FIGS. 1 to 10.

[1-1. Configuration of Case]

A terminal device of the example of the first embodiment is an example applied to a waterproof mobile phone terminal device.

Figure 2:
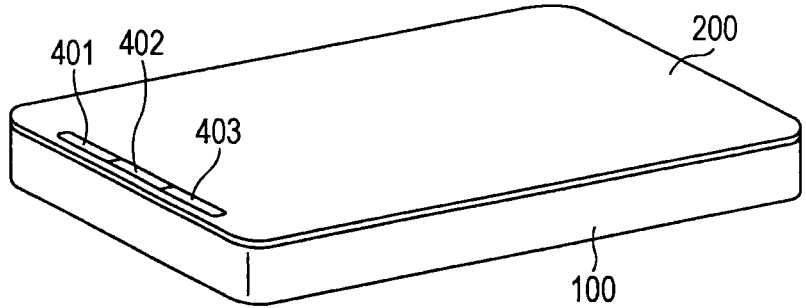
FIG. 2 is a perspective view showing a state in which the cases according to the first embodiment of this disclosure are assembled.

FIG. 1 is an exploded view of cases of the terminal device of the example of the first embodiment. FIG. 2 is a diagram showing a state in which the cases shown in FIG. 1 are assembled.

As shown in FIG. 1, the cases constituting the terminal device are divided into a first case 100 and a second case 200, and the first case 100 and the second case 200 are joined together when assembled. The first case 100 includes a side wall portion 110. An upper end ill of the side wall portion 110 serves as a connecting portion with respect to the second case 200. Note that, when directions, such as an upper side and a lower side, are mentioned in the following description, the side on which the first case 100 is disposed corresponds to the lower side, and the side on which the second case 200 is disposed corresponds to the upper side, as shown in FIG. 1.

The upper end 111 of the side wall portion 110 has a groove 112. The groove 112 continuously extends over the entire upper end 111, except for a key-disposing portion 113 described below. When the first case 100 is joined to the second case 200, a gasket 300 is inserted into the groove 112. The width of a portion of the gasket 300 inserted into the groove 112 is slightly larger than the width of the groove 112. This gasket 300 serves as a seal member for sealing a gap at the connecting portion between the first case 100 and the second case 200.

The gasket 300 is formed in a loop shape, and a large-width portion 310 is provided at a portion corresponding to the key-disposing portion 113 described below. The configuration of the gasket 300 will be described below.

When the first case 100 and the second case 200 are joined, for example, one of the first case 100 and the second case 200 is provided with a projection and the other is provided with a recess with which the projection is engaged. By engaging the projection and the recess, the first case 100 and the second case 200 are kept joined. Alternatively, the first case 100 and the second case 200 may be joined by using a fastening member, such as a screw. In the drawings, a mechanism for maintaining the cases joined is omitted.

Furthermore, as shown in FIG. 2, three keys 401, 402, and 403 are disposed on a surface of the second case 200. The three keys 401, 402, and 403 are disposed side-by-side, near the edge of the surface of the second case 200.

The second case 200 has a key-disposing through-hole 201 in which the keys 401, 402, and 403 are disposed. When the first case 100 and the second case 200 are assembled, as shown in FIG. 2, tips of the keys 401, 402, and 403 are exposed from the key-disposing through-hole 201.

As shown in FIG. 1, a switch substrate 500 is disposed below the three keys 401, 402, and 403. The switch substrate 500 includes three switch members 501, 502, and 503. When the first case 100 and the second case 200 are assembled, the key 401 is located above the switch member 501. Similarly, the key 402 is located above a switch member 502, and the key 403 is located above the switch member 503. When a user performs a key operation of pressing the key 401, 402, or 403, the corresponding switch member 501, 502, or 503 is pressed and outputs a signal corresponding to the operation.

The large-width portion 310 of the gasket 300 is disposed between the switch substrate 500 and the three keys 401, 402, and 403. The large-width portion 310 of the gasket 300 is shaped so as to fit into the key-disposing portion 113 in the first case 100.

[1-2. Configuration of Gasket]

Figure 3:
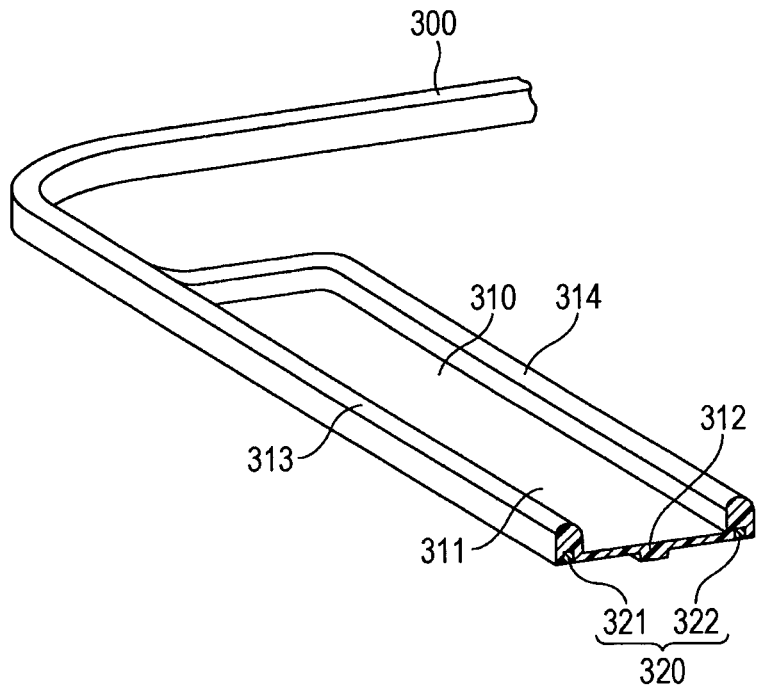
FIG. 3 is a perspective view showing the cross-section of a part of a gasket disposed in the cases according to the first embodiment of this disclosure.

FIG. 3 is a diagram showing the cross-section of a part of the gasket 300.

The gasket 300 is formed of a flexible resin. For example, the gasket 300 is formed of silicone or elastomer resin.

As shown in FIG. 3, the portion of the gasket 300 other than the large-width portion 310 has a cross-sectional shape corresponding to the groove 112 in the first case 100 and is continuous.

The portion other than the large-width portion 310 is inserted into the groove 112 and is deformed, thereby serving as a seal member for sealing between the first case 100 and the second case 200. The portion of the gasket 300 other than the large-width portion 310 may have any cross-sectional shape, such as a circular shape, an oval shape, or a trapezoidal shape, corresponding to the groove 112.

The large-width portion 310 has rims 313 and 314 diverged into two. The portion between the rims 313 and 314 is closed with a flat surface portion 311 having a small thickness. Three projections 312 are provided below the flat surface portion 311. The tree projections 312 are disposed corresponding to the switch members 501, 502, and 503.

A core member 320 is disposed inside the gasket 300 so as to correspond to the entire circumference thereof. FIG. 1 shows the gasket 300 and the core member 320 in a separate manner. The shape of the core member 320 shown in FIG. 1, i.e., a loop shape conforming to the shape of the gasket 300, is just an example. In practice, to ensure the flexibility of the gasket 300, the core member 320 desirably has unconnected gap portions appropriately provided at certain positions. Alternatively, the core members 320 may be disposed only inside portions of the gasket 300 inserted into curved portions of the groove 112 shown in FIG. 1. The core member 320 is disposed inside the gasket 300. FIG. 1 shows the gasket 300 and the core member 320 in a separate manner to show the shape of the core member 320.

The core member 320 may have any cross-sectional shape. For example, if the gasket 300 has a circular cross-sectional shape, the core member 320 may have a circular cross-sectional shape. The core member 320 may also have a cross-sectional shape different from the cross-sectional shape of the gasket 300. Furthermore, the core member 320 may change in the cross-sectional shape, width, or the like, in the middle thereof.

The core member 320 is made of a member harder than the gasket 300. For example, for the core member 320, a resin material, such as polycarbonate, ABS resin, or nylon, or a metal material, such as aluminum or magnesium, is used.

Because of the core member 320 disposed inside the gasket 300, the shape of the gasket 300 is maintained in a substantially rectangular shape conforming to the shape of the groove 112, as shown in FIG. 1.

The core member 320 disposed in the large-width portion 310 of the gasket 300 includes two branch portions 321 and 322. The branch portions 321 and 322 are fitted into the two rims 313 and 314 of the large-width portion 310. The core member 320 is not disposed in the flat surface portion 311 between the rims 313 and 314.

[1-3. Configuration of Key-Disposing Portion]

Figure 4:
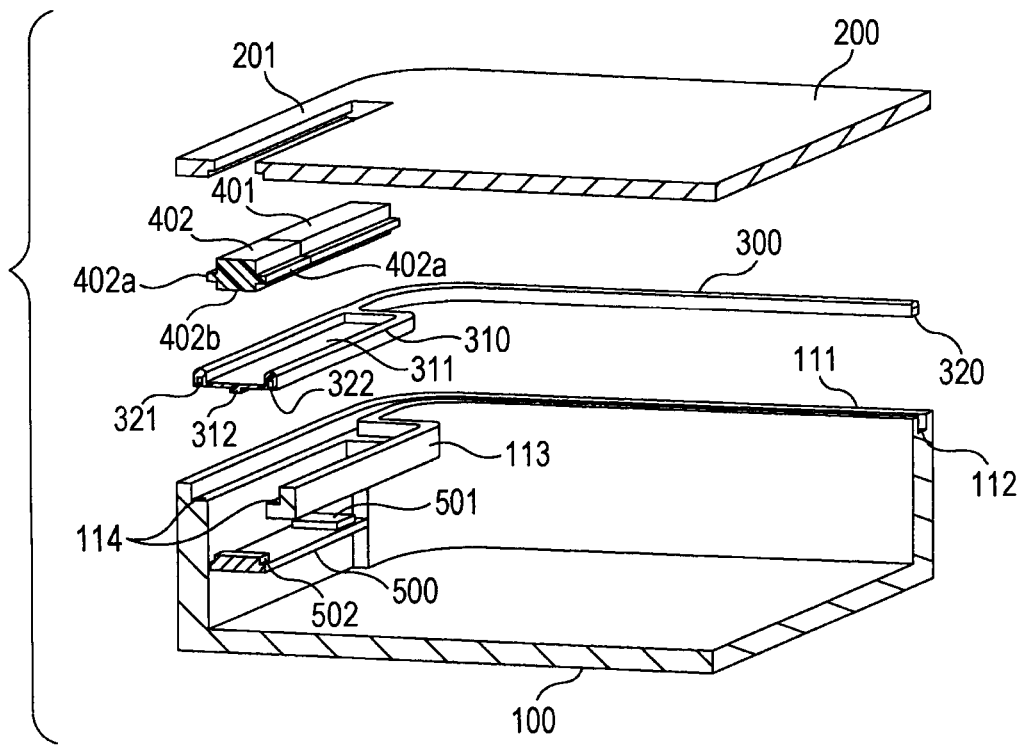
FIG. 4 is a cross-sectional view showing the cross-section of the cases according to the first embodiment of this disclosure in an exploded manner.
Figure 5:
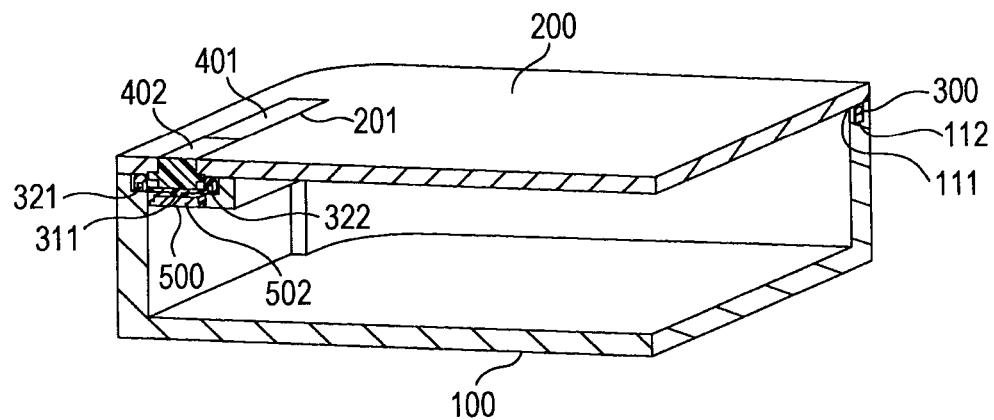
FIG. 5 is a cross-sectional view showing a state in which the cases of the example in FIG. 4 are assembled.

FIG. 4 is a diagram showing the cross-section of a portion near the key-disposing portion 113 in an exploded manner. FIG. 5 is a diagram showing a state in which the respective members in FIG. 4 are assembled.

As shown in FIG. 4, the key-disposing portion 113 of the first case 100 has a step portion 114, and the large-width portion 310 of the gasket 300 is fitted to the step portion 114.

The switch substrate 500 is disposed in the key-disposing portion 113 below the large-width portion 310.

Furthermore, the keys 401, 402, and 403 are disposed above the large-width portion 310 of the gasket 300. In FIGS. 4 and 5, the key 402 is shown in cross-section, and the key 403 is not shown. Although the shape of the key 402 will be described in the following description, the shapes of the keys 401 and 403 are the same as that of the key 402.

The key 402 has a shape such that rims 402a protrude therefrom. When the key 402 is disposed in the key-disposing through-hole 201 in the second case 200, the rims 402a come into contact with the periphery of the key-disposing through-hole 201, whereby the key 402 is held by the key-disposing through-hole 201.

As shown in FIG. 5, which shows the first case 100 and the second case 200 in an assembled state, a bottom surface 402b of the key 402 comes into contact with the flat surface portion 311 of the large-width portion 310 of the gasket 300. Furthermore, the projections 312 below the flat surface portion 311 come into contact with the switch member 502 on the switch substrate 500.

Figure 6:
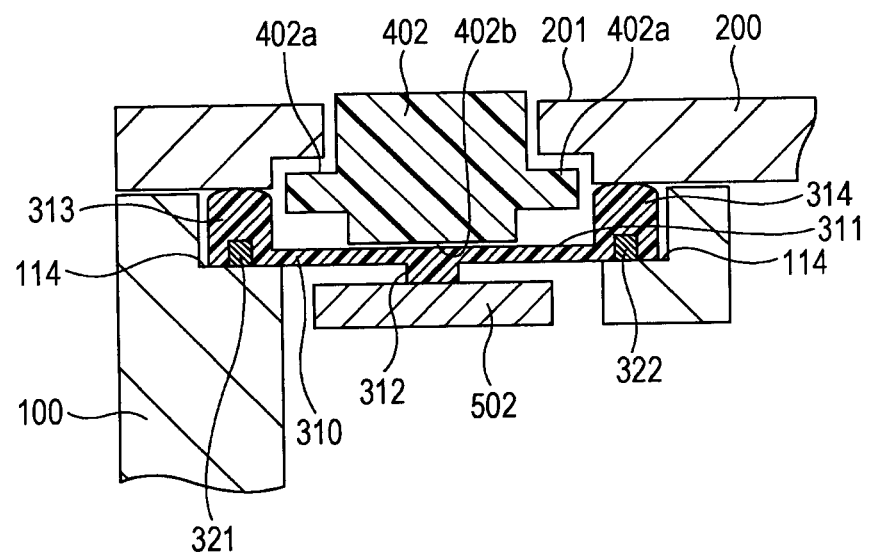
FIG. 6 is a cross-sectional view showing a key-disposing portion in the cases according to the first embodiment of this disclosure.

FIG. 6 is a diagram showing the cross-section of the portion near the key-disposing portion 113 in an enlarged state.

When the large-width portion 310 is fitted to the step portion 114, as shown in FIG. 6, the two rims 313 and 314 of the large-width portion 310 are in intimate contact with the bottoms of the step portion 114 without any gap therebetween. Furthermore, upper parts of the rims 313 and 314 are in intimate contact with the second case 200 without any gap therebetween. Because of these intimate contact states, the large-width portion 310 of the gasket 300 serves as a seal member for sealing a gap in the key-disposing portion 113.

With the gasket 300 sealing the key-disposing portion 113, once a pressing down operation of the key 402 is performed, the switch member 502 outputs a signal corresponding to the operation.

As has been described, when the first case 100 and the second case 200 are joined, the gasket 300 is disposed at the connecting portion therebetween so that the large-width portion 310 of the gasket 300 serves as the seal member for sealing the periphery of the key-disposing portion 113. Thus, an excellent waterproof performance can be achieved with a simple structure. That is, one gasket 300 serves not only as a seal member for sealing the gap between the two cases 100 and 200, but also as a seal member for sealing the periphery of the key-disposing portion 113. Therefore, it is only necessary to dispose one gasket 300, serving as a sealing member, when the first case 100 and the second case 200 are joined.

Furthermore, because of the rigid core member 320, the gasket 300 is maintained in the shape conforming to the shapes of the groove 112 and the key-disposing portion 113 to which the gasket 300 is fitted. More specifically, although the gasket 300 needs to be formed of a flexible resin material to ensure the sealing performance, the provision of the core member 320 realizes a higher rigidity than the rigidity of the gasket itself. Thus, when the first case 100 and the second case 200 are joined, the gasket 300 can be relatively easily fitted to the groove 112 and the key-disposing portion 113, and an excellent working efficiency is achieved.

In particular, regarding the large-width portion 310 of the gasket 300, the core member 320 is provided with the branch portions 321 and 322 corresponding to the shape of the large-width portion 310, thereby increasing the rigidity. Thus, the large-width portion 310 not only appropriately functions as a seal member for sealing the key-disposing portion, but also makes it easy to seal the key-disposing portion.

[1-4. Modification 1]

Figure 7:
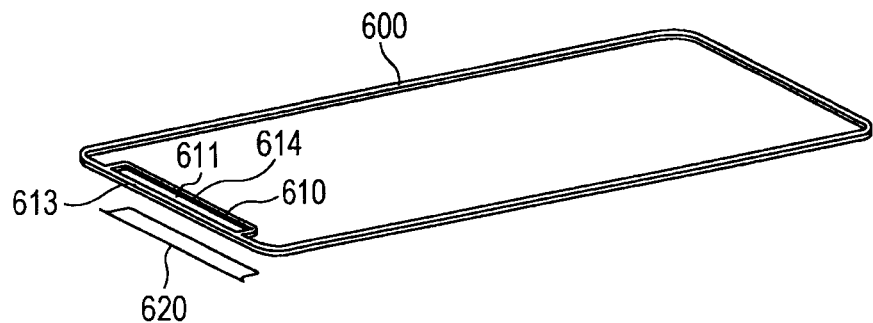
FIG. 7 is a perspective view showing a modification of a gasket disposed in the cases according to the first embodiment of this disclosure (an example in which a core member is disposed only partially).

FIG. 7 is a diagram showing a modification of the gasket. FIG. 7 shows a gasket 600 and a core member 620 in an exploded manner.

The gasket 600 shown in FIG. 7 has a cross-sectional shape corresponding to a groove 112 in a first case 100, is continuous, and has a large-width portion 610. The large-width portion 610 has rims 613 and 614, and a portion between the two rims 613 and 614 constitutes as a flat surface portion 611. The external shape of this gasket 600 is the same as the gasket 300 shown in FIG. 1.

Furthermore, the core member 620 is disposed inside the rims 613 and 614. The core member 620 is not provided in the portion other than the rims 613 and 614.

By using this gasket 600 having the configuration shown in FIG. 7 instead of the gasket 300 shown in FIG. 1, the first case 100 and the second case 200 are joined. This joint provides the same advantages as those achieved by using the gasket 300. However, because this gasket 600 does not have a core member at the portion other than the large-width portion 610, when the gasket 600 is disposed in the groove 112, joining has to be performed while the gasket 600 is positioned with respect to the groove 112. However, because the core member 620 is disposed in the large-width portion 610 of the gasket 600, the shape of the large-width portion 610, which has a complex shape, is stabilized by the core member 620. Thus, a relatively good working efficiency is obtained.

[1-5. Modification 2]

Figure 8:
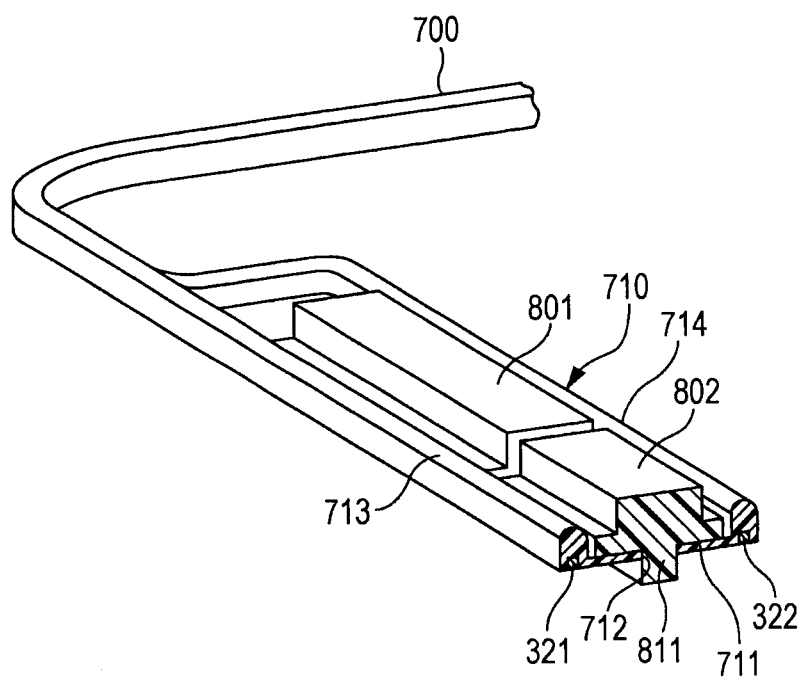
FIG. 8 is a perspective view showing the cross-section of the modification gasket disposed in the cases according to the first embodiment of this disclosure (an example in which the gasket is integrated with the key).
Figure 9:
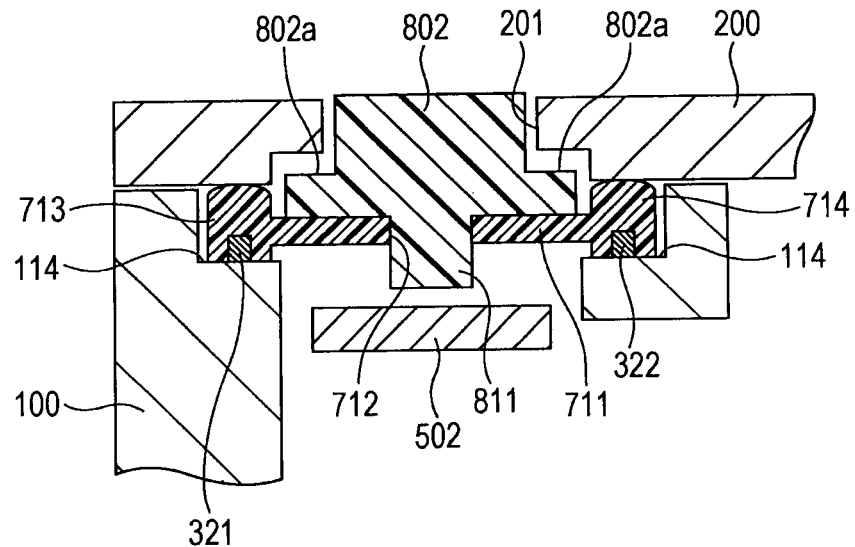
FIG. 9 is a cross-sectional view showing a state in which the gasket of the example in FIG. 8 is disposed in the cases.

FIGS. 8 and 9 are diagrams showing another modification of the gasket.

A gasket 700 shown in FIGS. 8 and 9 is different from the gasket 300 shown in FIG. 1 in that it is integrated with keys 801 and 802.

As shown in FIG. 8, a large-width portion 710 of the gasket 700 includes a flat surface portion 711 between rims 713 and 714. This large-width portion 710 is provided corresponding to the key-disposing portion 113 of the first case 100 shown in FIG. 1.

Furthermore, a through-hole 712 is provided in the middle of the flat surface portion 711 of the gasket 700. A projection 811 on the bottom surface of the key 802 protrudes further toward the lower side than the through-hole 712. The through-hole 712 is provided for each key.

The keys 801 and 802 and the gasket 700 are formed as a single component from different resin materials by using, for example, a coinjection molding method or the like. More specifically, the gasket 700 itself is formed of a flexible resin material, the keys 801 and 802 are formed of a rigid resin material, and then the gasket 700 and the keys 801 and 802 are integrated together. By forming the keys 801 and 802 and the gasket 700 as a single component in this manner, the gap between the projection 811 on the bottom surface of the key 802 and the through-hole 712 in the gasket 700 can be eliminated.

FIG. 9 is a diagram showing the cross-section of the portion near the key-disposing portion 113 when the first case 100 and the second case 200 are assembled.

The projection 811 on the bottom surface of the key 802 protrudes downward through the through-hole 712 provided in the flat surface portion 711 of the gasket 700. At this time, because the flat surface portion 711 of the gasket 700 and the key 802 are integrated, the gap between the key 802 and the through-hole 712 is completely sealed by the gasket 700.

Note that the gasket 700 is provided with the core member 320, similarly to the gasket 300 shown in FIG. 3. As shown in the cross-sectional view in FIG. 9, the branch portions 321 and 322 of the core member 320 are disposed inside the rims 713 and 714 of the large-width portion 710.

Because the use of the gasket 700 shown in FIGS. 8 and 9 enables the key members to be integrated with the gasket 700, the key members do not need to be separately disposed when assembling the first case 100 and the second case 200, and thus, the working efficiency improves correspondingly.

Note that the core member 320 and the keys 801 and 802 may be made of the same resin material and the core member 320 and the keys 801 and 802 may be formed simultaneously.

[1-6. Modification 3]

Figure 10:
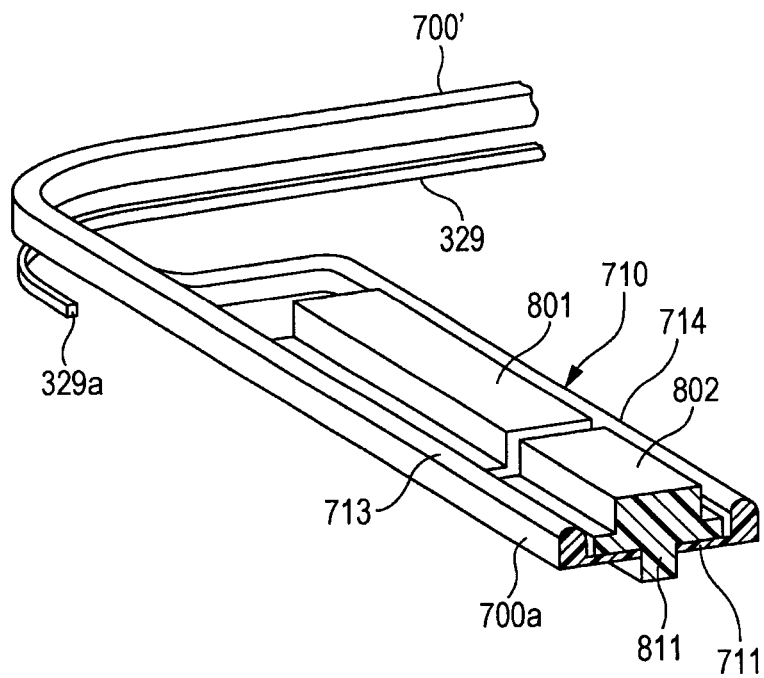
FIG. 10 is a perspective view showing another example of the gasket of the example in FIG. 8 (an example in which a portion of the core member is omitted).

A gasket 700' shown in FIG. 10 is obtained by further modifying the gasket 700 of the example in FIG. 8.

The external shape of the gasket 700' shown in FIG. 10 is the same as that of the gasket 700 of the example in FIG. 8. That is, the keys 801 and 802 and the gasket 700' are formed as a single component, and the projection 811 on the bottom portion of the key protrudes downward through the through-hole 712 provided in the flat surface portion 711.

A core member 329 to be disposed inside the gasket 700' is provided at a portion other than the large-width portion 710. FIG. 10 shows the gasket 700' and the core member 329 in a separate manner. An end 329a of the core member 329 is located at a position short of the large-width portion 710, and the core member 329 is not provided inside the rims 713 and 714 of the large-width portion 710.

The other portions of the gasket 700' have the same configuration as the gasket 700.

Although the core member 329 is not disposed at the large-width portion 710 in the gasket 700' shown in FIG. 10, the keys 801 and 802, which are integral with the gasket 700', function as members that give the large-width portion 710 rigidity. Accordingly, the shape of the gasket 700' is maintained, whereby the working efficiency when assembling the first case 100 and the second case 200 improves.

2. Second Embodiment

Next, an example of a second embodiment of this disclosure will be described with reference to FIGS. 11 to 15. In FIGS. 11 to 15, parts corresponding to FIGS. 1 to 10, which have been described in the first embodiment, are denoted by the same reference numerals.

[2-1. Configuration of Case]

A terminal device of the example of the second embodiment is an example applied to a waterproof mobile phone terminal device, similarly to the example of the first embodiment. In the example of the second embodiment, keys are disposed on a side surface of the first case 100.

Figure 11:
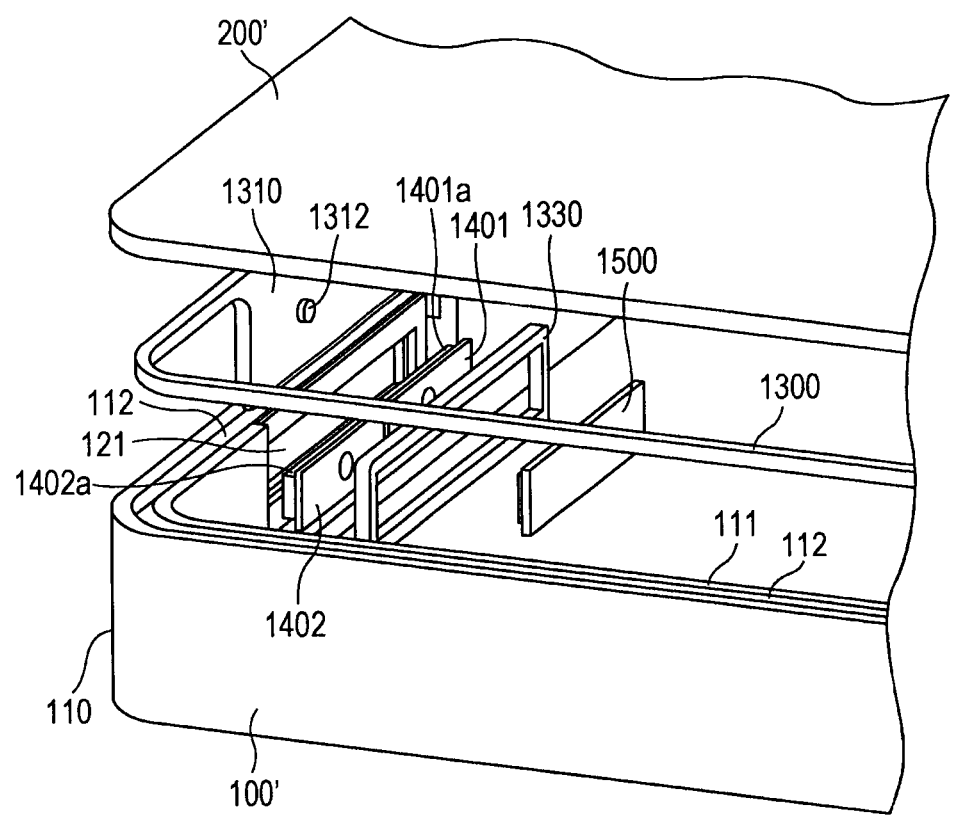
FIG. 11 is a perspective view showing cases according to a second embodiment of this disclosure in an exploded manner.

FIG. 11 is a diagram showing a key-disposing portion of the cases of the terminal device of the example of the second embodiment, in an exploded manner. As shown in FIG. 11, the cases constituting the terminal device are divided into a first case 100' and a second case 200', and the first case 100' and the second case 200' are joined during assembly. The first case 100' includes a side wall portion 110. An upper end 111 of the side wall portion 110 serves as a connecting portion with respect to the second case 200'.

The side wall portion 110 has a through-hole 121 in which the keys are disposed. The upper end 111 of the side wall portion 110 is provided with a groove 112. The groove 112 is provided over the entire circumference of the side wall portion 110, except for a portion where the through-hole 121 is provided. A gasket 1300 is inserted into the groove 112 when the first case 100' and the second case 200' are joined. The gasket 1300 has a large-width portion 1310 corresponding to the key-disposing portion. The configuration of the gasket 1300 will be described below.

Two keys 1401 and 1402 are disposed side-by-side in the through-hole 121 in the side wall portion 110. The two keys 1401 and 1402 are shaped such that they have protruding rims 1401a and 1402a so as not to be detached from the through-hole 121 to the outside.

A switch substrate 1500 held by a switch holding member 1330 is disposed inside the keys 1401 and 1402. The switch substrate 1500 includes a switch member 1501 (FIG. 14) described below.

Furthermore, the large-width portion 1310 of the gasket 1300 is disposed between the switch substrate 1500 and the keys 1401 and 1402. The detailed positional relationship between the keys 1401 and 1402 and the gasket 1300 when assembled will be described in the descriptions of FIGS. 14 and 15.

[2-2. Configuration of Gasket]

Figure 12:
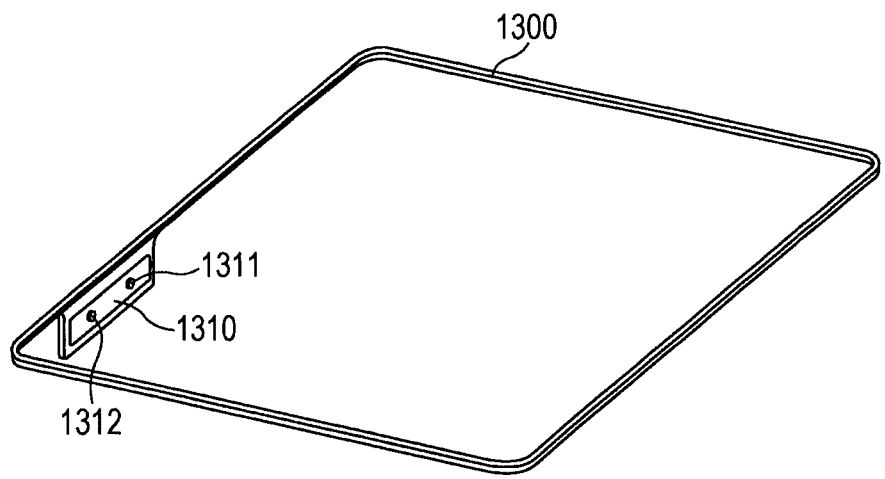
FIG. 12 is a perspective view showing a gasket according to the second embodiment of this disclosure.
Figure 13:
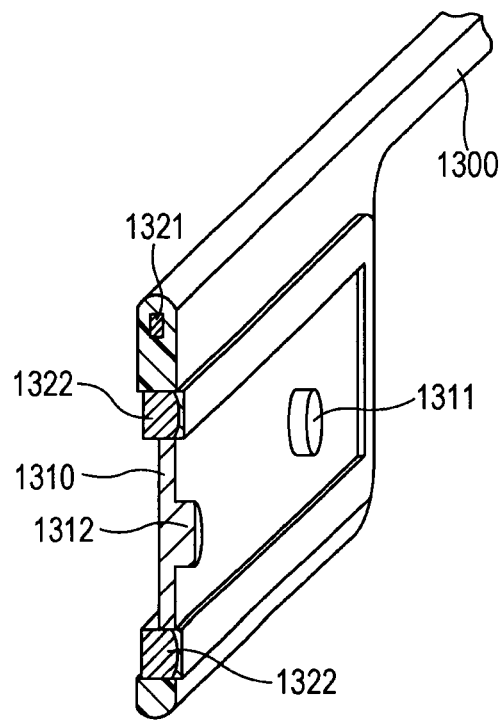
FIG. 13 is a perspective view showing the cross-section of a part of the gasket of the example in FIG. 12.

FIGS. 12 and 13 are diagrams showing the gasket 1300. FIG. 12 shows the entire gasket 1300, and FIG. 13 shows the large-width portion 1310 in an enlarged manner.

The gasket 1300 is formed of a flexible resin in a loop shape. The portion other than the large-width portion 1310 of the gasket 1300 is inserted into the groove 112 in the first case 100'. The large-width portion 1310 of the gasket 1300 is large enough to cover the entire through-hole 121 and is disposed parallel to the side wall portion 110 of the first case 100'. As shown in FIG. 13, core members 1321 and 1322 are disposed inside the gasket 1300. The core members 1321 and 1322 are made of a material harder than the resin constituting the gasket 1300. For example, the materials constituting the gasket 1300 and the core members 1321 and 1322 are the same materials as those described in the first embodiment.

The core member 1321 is disposed corresponding to the entire circumference of the loop-like gasket 1300. That is, similarly to the gasket 300 described in the first embodiment, the core member 1321 desirably has unconnected gap portions appropriately provided at certain positions. Alternatively, the core member 1321 may be disposed only inside portions of the gasket 1300 inserted into curved portions of the groove 112. The core member 1321 may have any cross-sectional shape and may change in the cross-sectional shape in the middle thereof.

The core member 1322 is a member disposed only at the large-width portion 1310. As shown in FIG. 13, this core member 1322, which has a rectangular frame, is disposed in the large-width portion 1310. A portion of the core member 1322 disposed in the large-width portion 1310 is exposed on the surface of the gasket 1300.

Although the two core members 1321 and 1322 are independent members, the gasket 1300 may have a connecting portion connecting the two core members 1321 and 1322, therein. Alternatively, it is also possible that only the frame-like core member 1322 is disposed at the large-width portion 1310 and that the core member 1321 is not disposed at the large-width portion 1310.

As shown in FIG. 13, the large-width portion 1310 of the gasket 1300 has projections 1311 and 1312 on the inside thereof. The portions where these projections 1311 and 1312 are disposed are aligned with the center parts of the portions where the two keys 1401 and 1402 are disposed.

[2-3. Configuration of Key-Disposing Portion]

Figure 14:
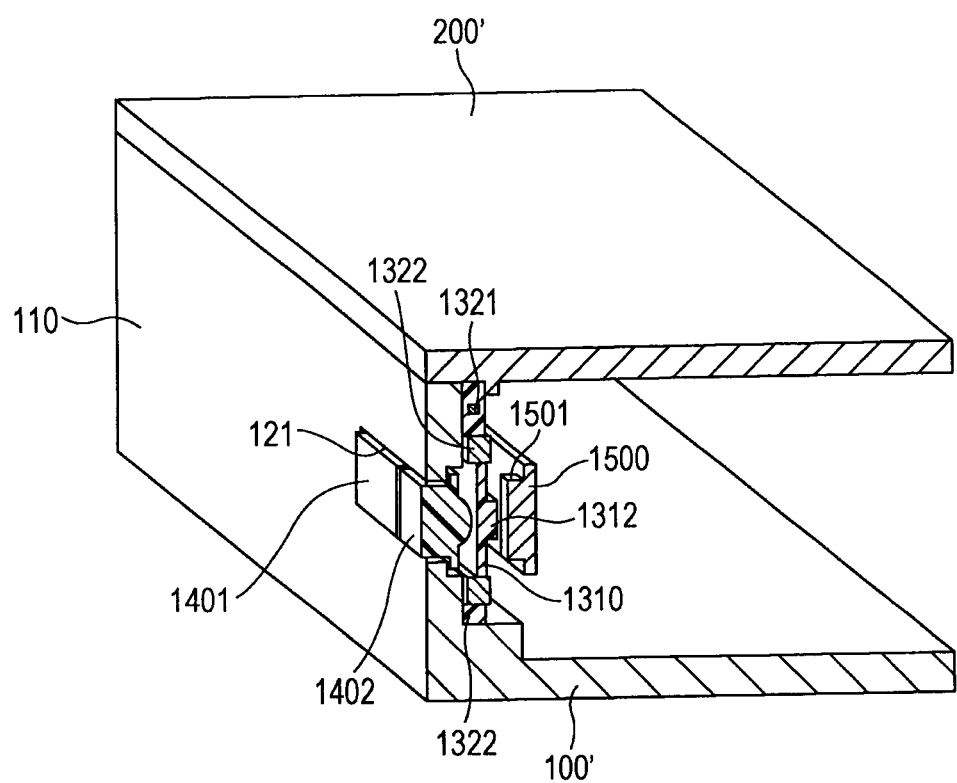
FIG. 14 is a perspective view showing the cross-section of the cases according to the second embodiment of this disclosure in an assembled state.

FIG. 14 is a diagram showing the cross-section of a key-disposing portion, when the first case 100' and the second case 200' are assembled. Furthermore, FIG. 15 is a diagram showing the cross-section of the key-disposing portion, in an assembled state, in an enlarged manner.

Figure 15:
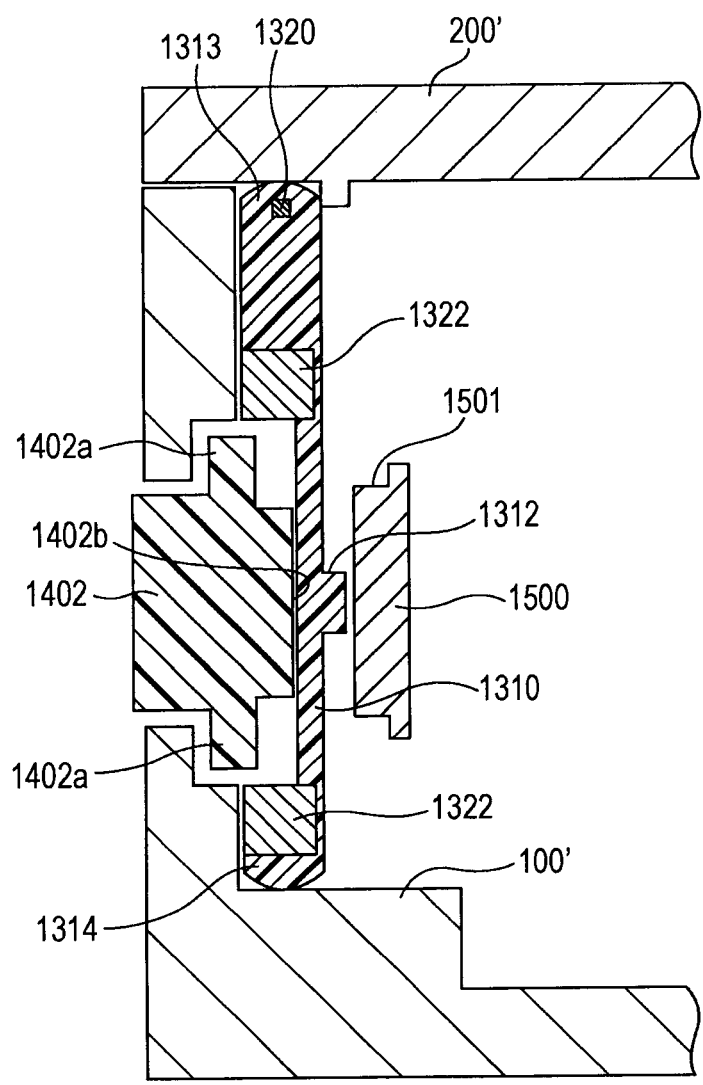
FIG. 15 is a cross-sectional view showing the cross-section of the example in FIG. 14 in an enlarged manner.

As shown in FIGS. 14 and 15, in the first case 100', the two keys 1401 and 1402 are disposed in the through-hole 121 in the side wall portion 110. The keys 1401 and 1402 face the switch substrate 1500 with the large-width portion 1310 of the gasket 1300 therebetween. For example, the key 1402 faces the switch member 1501 attached to the switch substrate 1500 with the large-width portion 1310 therebetween. The large-width portion 1310 facing the switch member 1501 is provided with a projection 1312, as shown in FIG. 15.

Thus, when a user performs an operation of pressing the key 1402 protruding from the through-hole 121 in the side wall portion 110, the projection 1312 of the gasket 1300 in contact with the key 1402 presses the switch member 1501, and then, the switch member 1501 outputs a signal corresponding to the operation.

Furthermore, as shown in FIG. 15, when the first case 100' and the second case 200' are assembled, an upper end 1313 of the large-width portion 1310 comes into contact with the inner surface of the second case 200', and a lower end 1314 of the large-width portion 1310 comes into contact with the inner surface of the first case 100'. Accordingly, the large-width portion 1310 of the gasket 1300 functions as a seal member for sealing a gap between the first case 100' and the second case 200', at the portion where the keys 1401 and 1402 are disposed. As shown in FIG. 11, at a portion other than the large-width portion 1310, the gasket 1300 inserted into the groove 112 in the side wall portion 110 of the first case 100' functions as the seal member.

As has been described, by the large-width portion 1310 of the gasket 1300 serving as a seal member for sealing a portion near the key-disposing through-hole 121 in the side wall portion 110, an excellent waterproof performance can be achieved with a simple structure. That is, one gasket 1300 serves not only as a seal member for sealing the gap between the two cases 100' and 200', but also as a seal member for sealing the portion near the key-disposing through-hole 121. Therefore, it is only necessary to dispose one gasket 1300, serving as a sealing member, when the first case 100' and the second case 200' are joined.

Furthermore, because of the core members 1321 and 1322 disposed therein, the gasket 1300 has a high rigidity and is maintained in the shape conforming to the shapes of the groove 112 and the key-disposing portion to which the gasket 1300 is fitted. Thus, the working efficiency when disposing the gasket 1300 improves.

3. Third Embodiment

Next, an example of a third embodiment of this disclosure will be described with reference to FIGS. 16 to 19. In FIGS. 16 to 19, parts corresponding to FIGS. 1 to 15, which have been described in the first and second embodiments, are denoted by the same reference numerals.

[3-1. Configuration of Case]

A terminal device of the example of the third embodiment is an example applied to a waterproof mobile phone terminal device, similarly to the examples of the first and second embodiments. In the example of the third embodiment, a terminal is disposed on a side surface of the first case 100.

Figure 16:
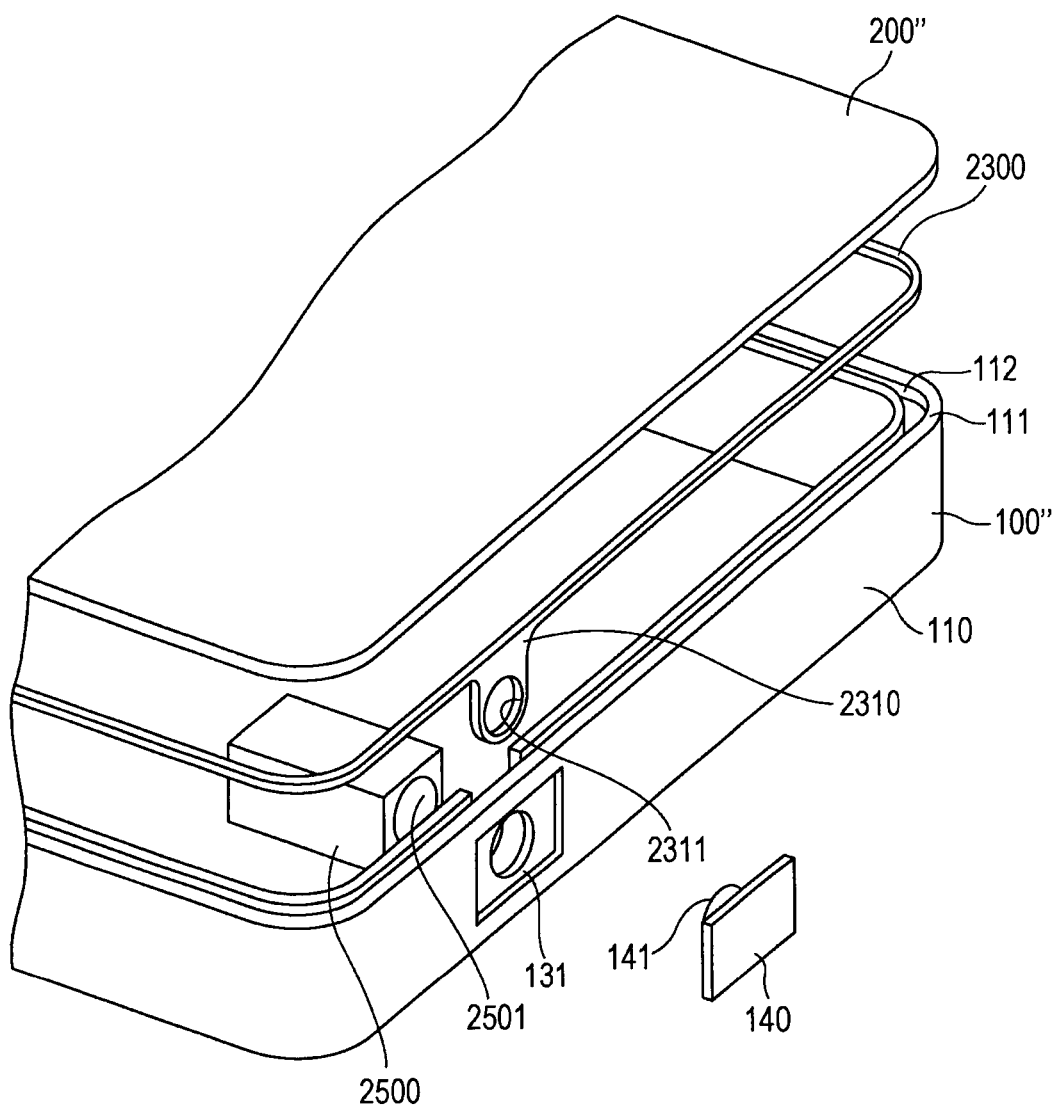
FIG. 16 is a perspective view showing a part of the cases according to a third embodiment of this disclosure in an exploded manner.

FIG. 16 is a diagram showing a key-disposing portion of the cases of the terminal device of the example of the third embodiment in an exploded manner. As shown in FIG. 16, the cases constituting the terminal device are divided into a first case 100" and a second case 200", and the first case 100" and the second case 200" are joined during assembly. The first case 100" includes a side wall portion 110. An upper end 111 of the side wall portion 110 serves as a connecting portion with respect to the second case 200".

The side wall portion 110 is provided with a terminal portion 131. A through-hole into which a plug is inserted is formed at the terminal portion 131 of the side wall portion 110. The upper end 111 of the side wall portion 110 is provided with a groove 112. The groove 112 is provided over the entire circumference of the side wall portion 110, except for a portion where the terminal portion 131 is provided. A gasket 2300 is inserted into the groove 112 when the first case 100' and the second case 200' are joined. By the gasket 2300 being inserted into the groove 112 in this manner, the gasket 2300 functions as a seal member for sealing a gap in the connecting portion of the first case 100' and the second case 200'. This gasket 2300 has a large-width portion 2310 corresponding to the terminal portion 131. The configuration of the gasket 2300 will be described below.

A terminal component 2500 is disposed inside the first case 100" that is continuous with the terminal portion 131 in the side wall portion 110. The terminal component 2500 includes a plug-insertion hole 2501 and is electrically connected to a plug that is inserted into the plug-insertion hole 2501. Note that, when the plug is not inserted into the terminal portion 131, a circular part 141 of a cap member 140 is fitted to the terminal portion 131 to close the terminal portion 131. The cap member 140 is formed of, for example, a resin material.

As shown in FIG. 16, the gasket 2300 includes a large-width portion 2310 that covers the inside of the terminal portion 131 of the side wall portion 110. The large-width portion 2310 has a circular hole portion 2311 at the center thereof, through which the plug passes.

Figure 17:
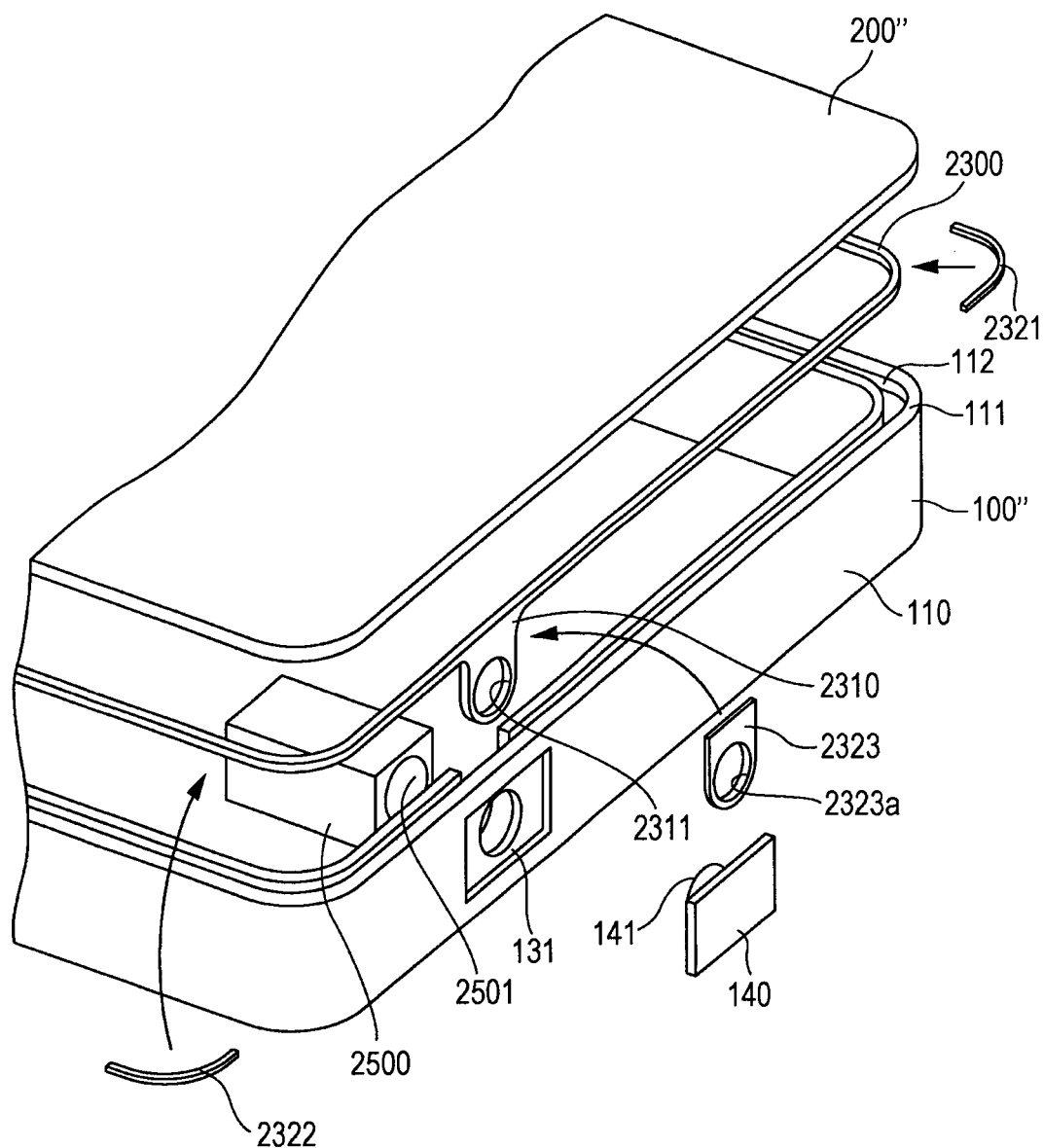
FIG. 17 is a perspective view showing core members of the gasket disposed in the cases of the example in FIG. 16 in a separate manner.
Figure 18:
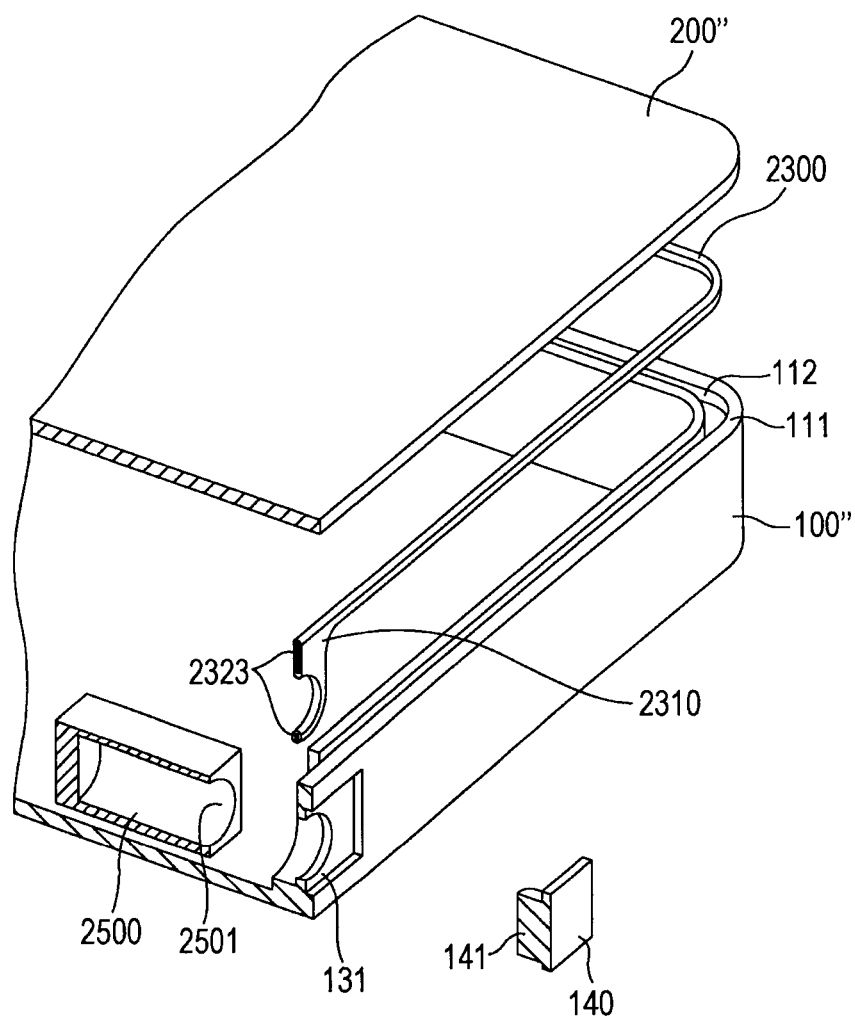
FIG. 18 is a perspective view showing the cross-section of a terminal portion of the cases of the example in FIG. 16.

FIG. 17 shows core members 2321, 2322, and 2323 disposed inside the gasket 2300, in a manner separate from the gasket 2300 body.

As shown in FIG. 17, the core members 2321 and 2322 are disposed inside parts of the gasket 2300 disposed at portions where the groove 112 in the side wall portion 110 is curved. Furthermore, the core member 2323 is disposed inside the large-width portion 2310 of the gasket 2300. As shown in FIG. 17, the core member 2323 has a circular through-hole 2323a corresponding to the circular hole portion 2311 in the large-width portion 2310. Each of the core members 2321, 2322, and 2323 is made of a material having a higher rigidity than the resin constituting the body of the gasket 2300. Note that the circular hole portion 2311 in the large-width portion 2310 has a slightly smaller diameter than the diameter of the plug to be inserted into the terminal portion 131. Furthermore, the gasket 2300 and the core members 2321 and 2322 are formed of, for example, the same material as the material described in the first embodiment. Note that the configuration in which the core members 2321 and 2322 are disposed only inside the parts of the gasket 2300 disposed at the portions where the groove 112 is curved, as shown in FIG. 17, may be applied to the gaskets 300 and 1300 described in the first and second embodiments, which have already been described above FIG. 18 is a diagram showing the cross-section of the terminal portion 131 of the side wall portion 110. As can be seen from FIG. 18, the core member 2323 is disposed inside the large-width portion 2310.

Note that, in the example in FIG. 17, an example in which the core member disposed inside the gasket 2300 is divided into a plurality of core members 2321 to 2323 is shown. However, a continuous core member may be disposed inside the loop-like gasket 2300.

[3-2. Configuration of Terminal Portion]

Figure 19:
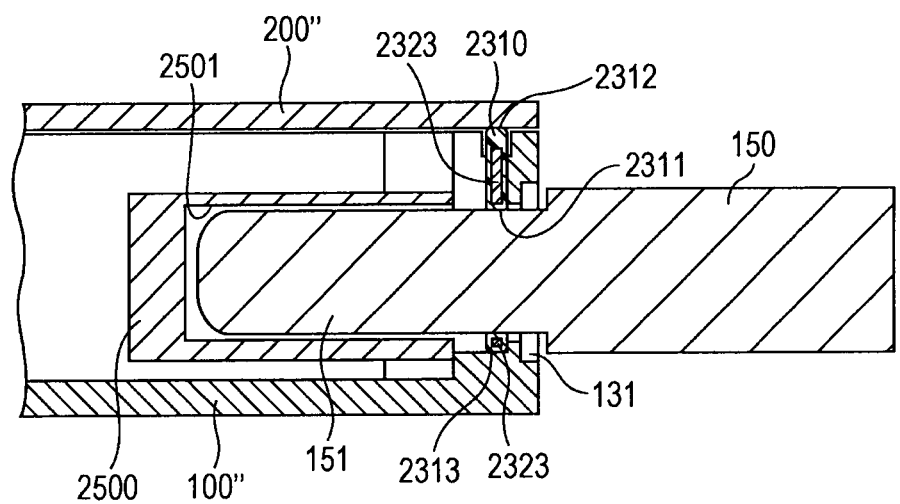
FIG. 19 is a cross-sectional view of the terminal portion of the cases of the example in FIG. 16.
Figure 20:
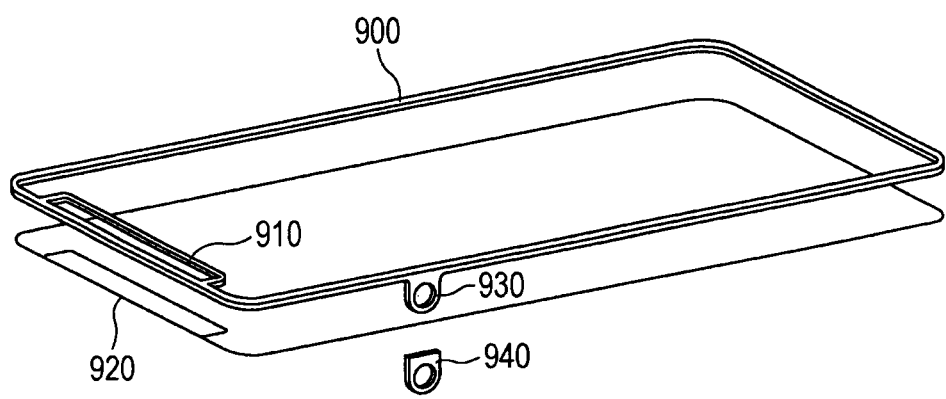
FIG. 20 is a perspective view showing another example of the gasket according to the embodiments of this disclosure.

FIG. 19 is a diagram showing the cross-section of the terminal portion 131 in an enlarged manner. In the case of FIG. 19, a state in which the plug 150 is inserted into the terminal portion 131 is shown.

As shown in FIG. 19, the large-width portion 2310 of the gasket 2300 is disposed inside the terminal portion 131 of the first case 100". At this time, an upper end 2312 of the large-width portion 2310 is in contact with the inner surface of the second case 200", and a lower end 2313 of the large-width portion 2310 is in contact with the inner surface of the first case 100". Furthermore, the circular hole portion 2311 of the large-width portion 2310 is in intimate contact with a conducting part 151 of the plug 150.

Accordingly, the large-width portion 2310 of the gasket 2300 functions as a seal member for sealing a gap between the first case 100" and the second case 200" near the terminal portion 131. At this time, no gap is generated between the plug 150 inserted into the terminal portion 131 and the circular hole portion 2311 in the large-width portion 2310 of the gasket 2300, and the function as a seal member is exhibited. Note that when the plug 150 is not inserted into the terminal portion 131, the cap member 140 shown in FIG. 16 is fitted to the terminal portion 131 and closes the terminal portion 131.

As shown in FIG. 16, at the portion other than the large-width portion 2310, the gasket 2300 inserted into the groove 112 in the side wall portion 110 of the first case 100" functions as a seal member for sealing the gap between the first case 100" and the second case 200".

As has been described, by the large-width portion 2310 of the gasket 2300 serving as the seal member for sealing a portion near the terminal portion 131 of the side wall portion 110, an excellent waterproof performance can be achieved with a simple structure. That is, one gasket 2300 functions not only as a seal member for sealing the gap between two cases 100" and 200", but also as a seal member for sealing a portion near the terminal portion 131. Therefore, it is only necessary to dispose one gasket 2300, serving as a sealing member, when the first case 100" and the second case 200" are joined.

Furthermore, because of the core members 2321 to 2323 disposed therein, the gasket 2300 has a high rigidity and is maintained in the shape conforming to the shapes of the groove 112 and the terminal portion 131 where the gasket 2300 is fitted. Thus, the working efficiency when disposing the gasket 2300 improves.

4. Other Modifications

Note that the shapes of the large-width portions of the gaskets, described in the first to third embodiments above, may be combined.

For example, one gasket may have both the large-width portion serving as the seal member for sealing the key-disposing portion, described in the first or the second embodiment, and the large-width portion serving as the seal member for sealing the portion where the terminal portion is disposed, described in the third embodiment. That is, one gasket is shaped to have a first large-width portion corresponding to the portion where the key is disposed and a second large-width portion corresponding to the portion where the terminal portion is disposed. By configuring the gaskets as a single gasket like this, a waterproof structure can be achieved with one gasket, even in a case where the cases have both the key and the terminal.

FIG. 20 is a diagram showing an example of the gasket in this case. As shown in FIG. 20, a large-width portion 910 for a key-disposing portion and a large-width portion 930 for a terminal portion are provided in one gasket 900 formed in a loop shape. Regarding the core members, for example, a core member 920 disposed in the entire gasket and the large-width portion 910 and a core member 940 disposed in the large-width portion 930 are prepared. With the thus-configured gasket 900, both of the portions where the key and the terminal are disposed can be made waterproof structure.

Furthermore, one gasket may have the large-width portion for the key disposed on the surface of the case, described in the first embodiment, and the large-width portion for the key disposed on the side surface of the case, described in the second embodiment.

Furthermore, the gasket and the core member inside the gasket shown in the examples of the respective embodiments may have shapes other than those shown in the drawings. More specifically, for example, the gasket disposed in the groove 112 shown in FIG. 1 may have any cross-sectional shape, such as a circular shape, an oval shape, or a trapezoidal shape. The core member disposed inside the gasket may also have any cross-sectional shape, such as a circular shape, an oval shape, or a trapezoidal shape. In such a case, the gasket and the core member may have different cross-sectional shapes. Furthermore, the cross-sectional shape of the core member may change partially. Furthermore, as described in the examples of the respective embodiments, gap portions where no core member is disposed inside the gasket may be provided.

Furthermore, in the examples of the respective embodiments, examples in which the gasket is used in the cases constituting a mobile phone terminal device have been described. However, the same gasket may be disposed in cases constituting other electronic devices to achieve a waterproof structure.

Furthermore, the configurations and processing disclosed in Claims of this disclosure are not limited to the examples of the above-described embodiments. It is understood that it is obvious for those skilled in the art that various modifications, combinations, other embodiment examples may occur depending on the design and other factors, so long as they are within the scope of Claims or the scope equivalent to Claims. Note that this disclosure may also have the following configuration.

(1) A gasket structure including a gasket that is disposed at a connecting portion between a first case and a second case, has a large-width portion at a certain portion of the first case where a key or a terminal is disposed, and is made of a flexible material; and a core member that is attached to at least the large-width portion of the gasket.

(2) The gasket structure according to (1), in which the large-width portion is provided at a portion where the key is disposed and has a shape filling a gap between the key and the first case, and a bottom surface of the key faces a member operated by the key, with the large-width portion of the gasket therebetween.

(3) The gasket structure according to (1) or (2), in which the large-width portion of the gasket is formed integrally and simultaneously with the key, and the bottom surface of the key is configured to be in direct contact with the member.

(4) The gasket structure according to any one of (1) to (3), in which the core member includes a first core member attached to the large-width portion and a second core member attached to a portion other than the large-width portion.

(5) The gasket structure according to any one of (1) to (4), in which the large-width portion has a through-hole that is provided at a portion where the terminal is disposed and that comes into intimate contact with a plug inserted into the terminal of the first case.

(6) A terminal device including a first case in which a key or a terminal is disposed at a certain portion; a second case joined to the first case; a gasket that is disposed at a connecting portion between the first case and the second case, has a large-width portion at the certain portion, and is made of a flexible material; and a core member that is attached to at least the large-width portion of the gasket.

REFERENCE SIGNS LIST 100, 100', 100": first case, 110: side wall portion, 111: upper end of side wall, 112: groove, 113: key-disposing portion, 114: step portion, 121: through-hole, 131: terminal portion, 140: cap member, 141: circular part, 150: plug, 151: conducting part, 200, 200', 200": second case, 201: key-disposing through-hole, 300: gasket, 310: large-width portion, 311: flat surface portion, 312: projection, 313, 314: rim, 320: core member, 321, 322: branch portion, 329: core member, 329a: end, 401, 402, 403: key, 402a: rim, 402b: bottom surface, 500: switch substrate, 501, 502, 503: switch member, 600: gasket, 610: large-width portion, 611: flat surface portion, 613, 614: rim, 620: core member, 700, 700': gasket, 710: large-width portion, 711: flat surface portion, 712: through-hole, 713, 714: rim, 801, 802: key, 802a: rim, 811: projection, 900: gasket, 910: large-width portion, 920: core member, 940: large-width portion, 950: core member, 1300: gasket, 1310: large-width portion, 1311, 1312: projection, 1313: upper end, 1314: lower end, 1321, 1322: core member, 1330: switch holding member, 1401, 1402: key, 1401a, 1402a: rim, 1500: switch substrate, 1501: switch member, 2300: gasket, 2310: large-width portion, 2311: circular hole portion, 2312: upper end, 2313: lower end, 2321, 2322, 2323: core member, 2500: terminal component, 2501: plug-insertion hole

What is claimed is:

1. A gasket structure comprising:
   a gasket that is disposed at a connecting portion between a first case and a second case, the gasket being in the form of a loop of a plurality of segments each corresponding to one of a plurality of respective perimeter sides of the first case and second case, where one of the plurality of segments of the gasket disposed at a perimeter side of the first case where a key or a terminal is disposed is a large-width portion which has a wider thickness than the remaining segments of the gasket in a direction normal to the perimeter side and is made of a flexible material; and
   a core member that is attached to at least the large-width portion of the gasket,
   wherein the large-width portion is provided at a portion where the key is disposed and has a shape filling a gap between the key and the first case, and a bottom surface of the key faces a member operated by the key, with the large-width portion of the gasket therebetween.

2. The gasket structure according to claim 1, wherein the large-width portion of the gasket is formed integrally and simultaneously with the key, and the bottom surface of the key is configured to be in direct contact with the member.

3. The gasket structure according to claim 1, wherein the core member includes a first core member attached to the large-width portion and a second core member attached to a portion other than the large-width portion.

4. The gasket structure according to claim 1, wherein the large-width portion has a through-hole that is provided at a portion where the terminal is disposed and that comes into contact with a plug inserted into the terminal of the first case.

5. A terminal device comprising:
   a first case in which a key or a terminal is disposed at a certain portion;
   a second case joined to the first case;
   a gasket that is disposed at a connecting portion between the first case and the second case, the gasket being in the form of a loop of a plurality of segments each corresponding to one of a plurality of respective perimeter sides of the first case and second case, where one of the plurality of segments of the gasket disposed at a perimeter side is a large-width portion which has a wider thickness than the remaining segments of the gasket in a direction normal to the perimeter side and is made of a flexible material; and
   a core member that is attached to at least the large-width portion of the gasket,
   wherein the large-width portion is provided at a portion where the key is disposed and has a shape filling a gap between the key and the first case, and a bottom surface of the key faces a member operated by the key, with the large-width portion of the gasket therebetween.

* * * * *